United States Patent
Chiba et al.

(10) Patent No.: US 7,522,422 B2
(45) Date of Patent: Apr. 21, 2009

(54) HEAT SINK

(75) Inventors: Hiroshi Chiba, Tokyo (JP); Tetsuro Ogushi, Tokyo (JP); Akira Yamada, Tokyo (JP); Hiroshi Yamabuchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/747,482

(22) Filed: May 11, 2007

(65) Prior Publication Data

US 2007/0211434 A1 Sep. 13, 2007

Related U.S. Application Data

(62) Division of application No. 10/866,790, filed on Jun. 15, 2004, now Pat. No. 7,254,030.

(30) Foreign Application Priority Data

Mar. 4, 2004 (JP) ............... 2004-061146

(51) Int. Cl.
*H05K 7/20* (2006.01)
(52) U.S. Cl. .............. 361/710; 361/702; 361/709; 361/711
(58) Field of Classification Search ......... 361/709, 361/702, 697, 710, 711, 699
See application file for complete search history.

(56) References Cited

U.S. PATENT DOCUMENTS

| 3,524,497 | A | * | 8/1970 | Chu et al. ............... 165/80.4 |
| 4,415,025 | A | | 11/1983 | Horvath |
| 5,006,924 | A | | 4/1991 | Frankeny et al. |
| 5,239,200 | A | * | 8/1993 | Messina et al. ............. 257/714 |
| 5,358,032 | A | | 10/1994 | Arai et al. |
| 5,884,691 | A | | 3/1999 | Batchelder |
| 6,351,384 | B1 | * | 2/2002 | Daikoku et al. ............ 361/704 |
| 6,401,807 | B1 | | 6/2002 | Wyler et al. |
| 6,466,438 | B1 | | 10/2002 | Lim |
| 6,765,793 | B2 | | 7/2004 | Kehret et al. |
| 6,798,663 | B1 | | 9/2004 | Rubenstein |
| 6,992,382 | B2 | | 1/2006 | Chrysler et al. |
| 7,017,655 | B2 | | 3/2006 | Wilson et al. |
| 7,044,199 | B2 | | 5/2006 | Thayer et al. |
| 2001/0033476 | A1 | | 10/2001 | Dibene et al. |
| 2005/0017350 | A1 | | 1/2005 | Corti et al. |

FOREIGN PATENT DOCUMENTS

JP 63-97292 6/1988

(Continued)

*Primary Examiner*—Anatoly Vortman
(74) *Attorney, Agent, or Firm*—Sughrue Mion, PLLC (57) ABSTRACT

A low-cost heat sink easy to assemble which is designed to be mounted on a power semiconductor module (5) through the medium of cooling water includes a base member (1), a heat sink body (2) superposed on the base member (1) to form in cooperation with the base member (1) a passage through which the coolant flows, and a bellows-like flow straightening plate (6) disposed between the power semiconductor module (5) and the base member (1) in physical contact with the power semiconductor module (5) on one hand and with the base member (1) on the other hand. The flow straightening plate (6) partitions the passage into a plurality of flow straightening channels (14A, 14B).

5 Claims, 7 Drawing Sheets

FOREIGN PATENT DOCUMENTS

| | | |
|---|---|---|
| JP | 6-275746 A | 9/1994 |
| JP | 8-111480 A | 4/1996 |
| JP | 2001-257296 A | 9/2001 |
| JP | 2002-235876 | 8/2002 |
| JP | 2002-324884 | 11/2002 |

* cited by examiner

HEAT SINK

This is a divisional of application Ser. No. 10/866,790 filed Jun. 15, 2004 now U.S. Pat. No. 7,254,030. The entire disclosure(s) of the prior application(s), application Ser. No. 10/866,790 is considered part of the disclosure of the accompanying divisional application and is hereby incorporated by reference.

BACKGROUND OF THE INVENTION

1. Field of the Invention

The present invention relates to a heat sink for cooling a power semiconductor module of a unitary structure in which power elements such as IGBTs (Insulated Gate Bipolar Transistors) constituting major parts of an electric power control device such as a general-purpose inverter or the like are incorporated.

2. Description of Related Art

Heretofore, in the general-purpose inverter for performing, for example, variable control of rotation speed (rpm) of an electric motor designed for industrial appliance, a power semiconductor module which incorporates therein IGBTs or the like is employed as a major device constituting a major part of the inverter circuit. The power semiconductor module generates heat in the course of operation. Consequently, cooling of the power semiconductor module is necessarily required. To this end, a heat sink is mounted on the power semiconductor module.

As a typical example of the heat sink, there may be mentioned the one in which a cover member is fit on a base member on which the power semiconductor module is mounted to form a hollow passage through which cooling air can flow. Disposed within the hollow passage is a corrugated tin which is formed by bending a thin plate in a corrugated shape. For more particulars, reference may have to be made to, for example, Japanese Patent Application Laid-Open Publication No. 257296/2001 (JP-A-2001-257296).

With the structure of the heat sink mentioned above, the heat emitting area which is brought into contact with the cooling air flow can certainly be increased owing to the wave-like structure of the corrugated fin with the heat transfer being thereby promoted. However, since the corrugated fin is fixedly secured to the base member and the cover member by brazing, the efficiency involved in assembling the heat sink is poor, as a result of which the manufacturing cost increases, giving rise to a problem.

SUMMARY OF THE INVENTION

In the light of the state of the art described above, it is an object of the present invention to solve the problem mentioned above by providing a heat sink structure which can be assembled with an enhanced efficiency with the manufacturing cost being reduced.

In view of the above and other objects which will become apparent as the description proceeds, there is provided according to a general aspect of the present invention a heat sink which includes a flow base member, a heat sink body superposed on the base member to form in cooperation with the base member a flow passage through which a coolant can flow, and a bellows-like flow straightening plate disposed between the heat radiation part and the base member in physical contact with the heat radiation part on one hand and with the base member on the other hand, which the flow passage is partitioned into a plurality of flow straightening channels by means of the flow straightening plate.

With the heat sink structure according to the present invention, the assembling efficiency can remarkably be enhanced, whereby the cost involved in manufacturing the heat sink can significantly be reduced.

The above and other objects, features and attendant advantages of the present invention will more easily be understood by reading the following description of the preferred embodiments thereof taken, only by way of example, in conjunction with the accompanying drawings.

BRIEF DESCRIPTION OF THE DRAWINGS

In the course of the description which follows, reference is made to the drawings, in which.

DESCRIPTION OF THE PREFERRED EMBODIMENTS

The present invention will be described in detail in conjunction with what is presently considered as preferred or typical embodiments thereof by reference to the drawings. In the following description, like reference characters designate like or corresponding parts throughout the several views. Also in the following description, it is to be understood that such terms as "top", "bottom" and the like are words of convenience and are not to be construed as limiting terms.

Embodiment 1

Now, the heat sink according to an embodiment of the present invention will be described by reference to FIGS. 1, 2, 3 and 4.

As can be seen in the figures, the heat sink includes a base member 1 made of aluminum in a plate-like form, a heat sink body 2 which is superposed on the base member 1 with a seal packing 10 being interposed therebetween and which cooperates with the base member 1 to form a passage through which cooling water serving as a coolant flows, and a bellows-like flow straightening plate 6 disposed between the base member 1 and a power semiconductor module 5 representative of a heat radiation part.

The power semiconductor module 5 is fixedly secured to the base member 1 with interposition of a seal packing 11 by means of screws or the like (not shown).

The power semiconductor module 5 includes an embedded power element or elements (not shown) bonded by soldering to a copper block which in turn is contacted to an insulation plate (not shown either) and is formed in a unitary chip by a transfer molding process.

The heat sink body 2 is formed of aluminum or the like exhibiting a high thermal conductivity by a die cast process. It should however be understood that the present invention is never restricted thereto. The heat sink body 2 may be formed of a resin material which is excellently suited to implementation in light weight by an injection molding.

The heat sink body 2 of a rectangular or quadrilateral frame-like form has one lateral or side portion in which an inlet port 3 is formed for allowing the cooling water to flow into the heat sink, while an outlet port 4 is formed in other side portion of the heat sink body 2 for allowing the cooling water to leave the heat sink. The space defined between the inlet port 3 and the outlet port 4 cooperates with the base member 1 to form a passage through which the cooling water can flow. The heat sink body 2 formed in the frame shape has an outer frame 2A surrounding an inner frame 2B, the outer frame 2A having a height (T) which is greater than a height (T1) of the inner frame 2B. The heat radiation part 5 is received inside the outer frame 2A and on top of the inner frame 2B of the heat sink body 2, while the heat sink body 2 is superposed on the base member 1 to form in cooperation with the base member the passage through which the coolant flows.

The flow straightening plate 6 is formed of stainless steal by a press molding process. The flow straightening plate 6 is disposed between the power semiconductor module 5 and the base member 1 in physical contact with a heat transfer surface 13 of the power semiconductor module 5 on one hand and with the top surface of the base member 1 on the other hand. More specifically, the flow straightening plate 6 is implemented as a foldable or collapsible corrugated plate having alternate ridge and furrow portions in a bellows-like fashion. The ridge portions of the flow straightening plate 6 positioned adjacent to the power semiconductor module 5 are so formed as to present flat portions 7 which are brought into surface contact with the heat transfer surface 13 of the power semiconductor module 5, whereas the furrow or bottom portions of the flow straightening plate 6 positioned adjacent to the base member 1 are placed in surface contact with the base member 1. With the arrangement that the flow straightening plate 6 is so disposed that the ridge portions thereof are in contact with the heat transfer surface 13 of the power semiconductor module 5 while the furrow or bottom portions being placed in contact with the base member 1, the coolant passage mentioned previously is partitioned into base-side flow straightening channels 14A in which the cooling water is placed in intimate contact with the base member 1 and heat-transfer-side flow straightening channels 14B in which the cooling water is placed in intimate contact with the heat transfer surface 13 of the power semiconductor module 5.

In the base-side flow straightening channels 14A, a plurality of ribs 9 are formed, respectively, being equally spaced in the direction in which the cooling water flows. These ribs 9 serve for preventing positional deviation of the flow straightening plate 6 relative to the base member 1 and the power semiconductor module 5 for thereby securing the base-side flow straightening channels 14A.

With the structure of the heat sink in which the flow straightening plate 6 is disposed between the power semiconductor module 5 and the base member 1 with the ridge portions thereof being in physical contact with the heat transfer surface of the power semiconductor module 5 while the furrow portions directly or intimately contact the base member 1, troublesome assembling work such as fixedly securing of the flow straightening plate 6 to the power semiconductor module 5 and the base member 1 by brazing is rendered unnecessary. Thus, efficiency involved in assembling the heat sink can be enhanced, whereby the manufacturing cost can be reduced.

Further, since the flow straightening plate 6 can be formed of a thin steel plate by press molding with fine corrugation in a thickness of 0.3 mm to 0.5 mm with a pitch on the order of 1 mm to 1.5 mm, the contact area for the cooling water can be increased when compared with the fins formed by the die cast or extrusion. Thus, the heat transfer efficiency of the heat sink according to the instant embodiment of the invention can significantly be increased.

Furthermore, because the flow straightening plate 6 is formed with the flat portions 7 which are brought into surface contact with the heat transfer surface 13, a large transfer area is assured for the heat flux transferred from the power semiconductor module 5 to the flow straightening plate 6, whereby the heat transfer efficiency can be enhanced.

Besides, because the cooling water passage is partitioned into a plurality of flow straightening channels 14A; 14B by means of the flow straightening plate 6, the flow of the cooling water is uniformized, whereby the radiation performance is also uniformized correspondingly.

Figure 1:
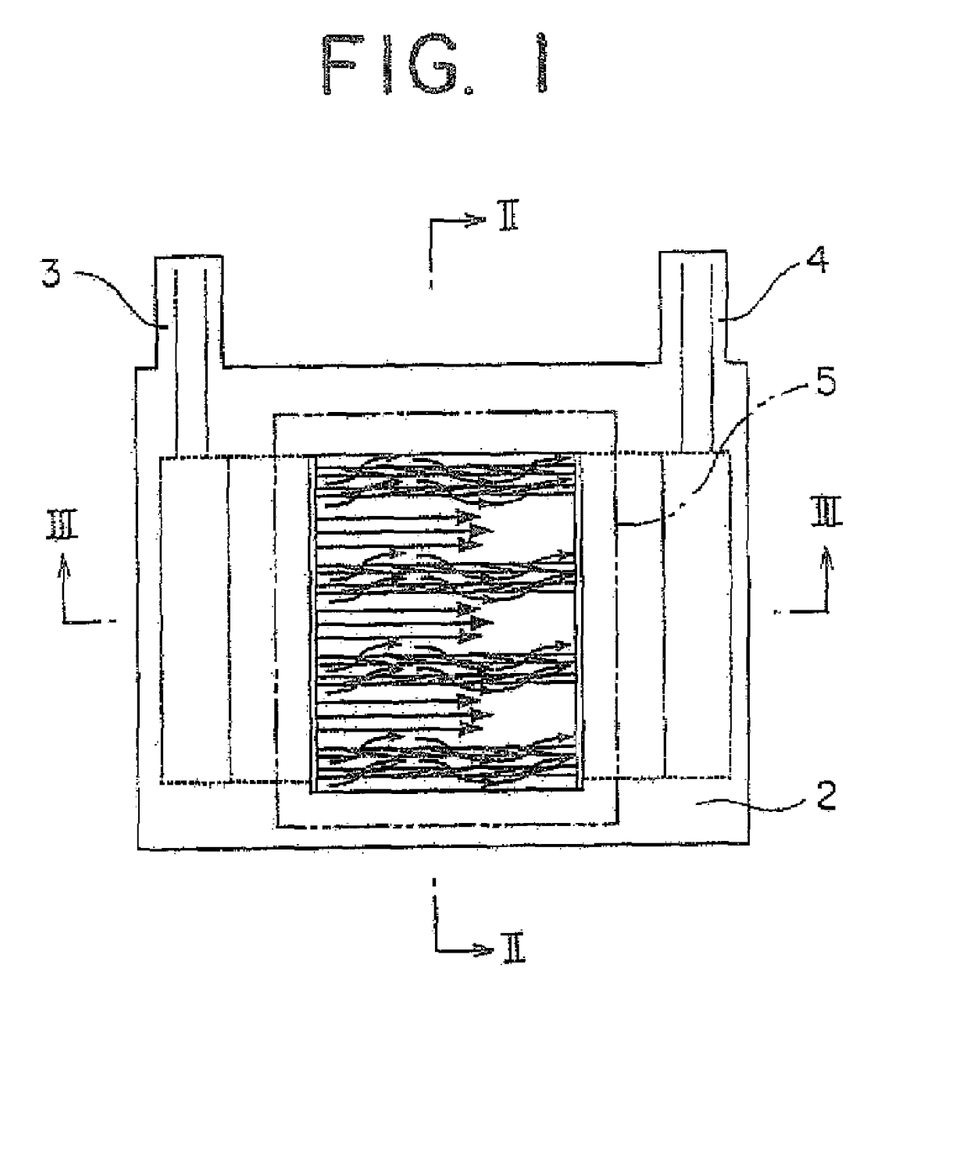
FIG. 1 is a plan view showing a heat sink according to a first embodiment of the present invention.
Figure 2:
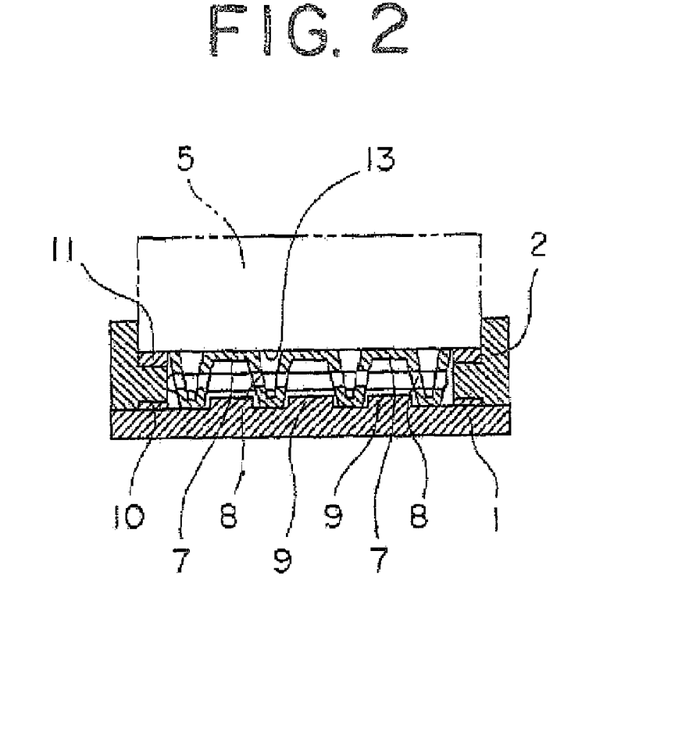
FIG. 2 is a sectional view of the heat sink taken along a line II-II and viewed in the direction indicated by arrows in FIG. 1.
Figure 3:
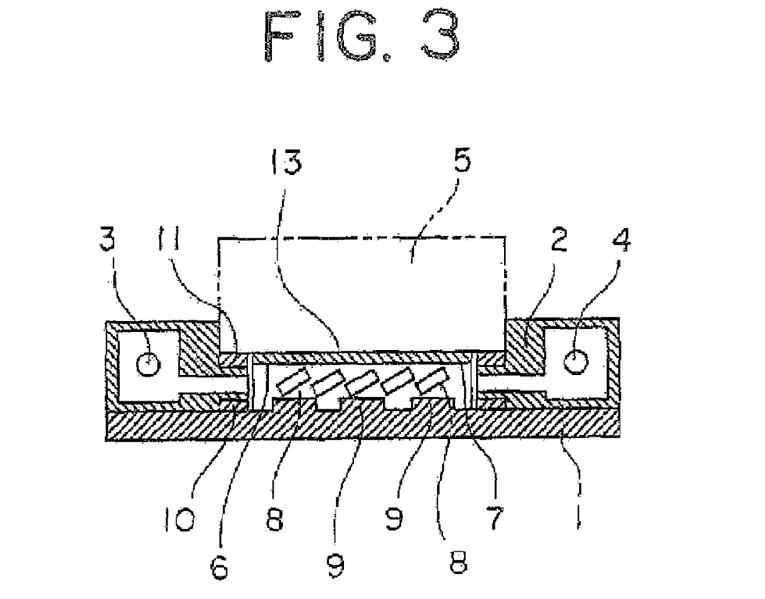
FIG. 3 is a sectional view of the heat sink taken along a line III-III and viewed in the direction indicated by arrows in FIG. 1.
Figure 4:
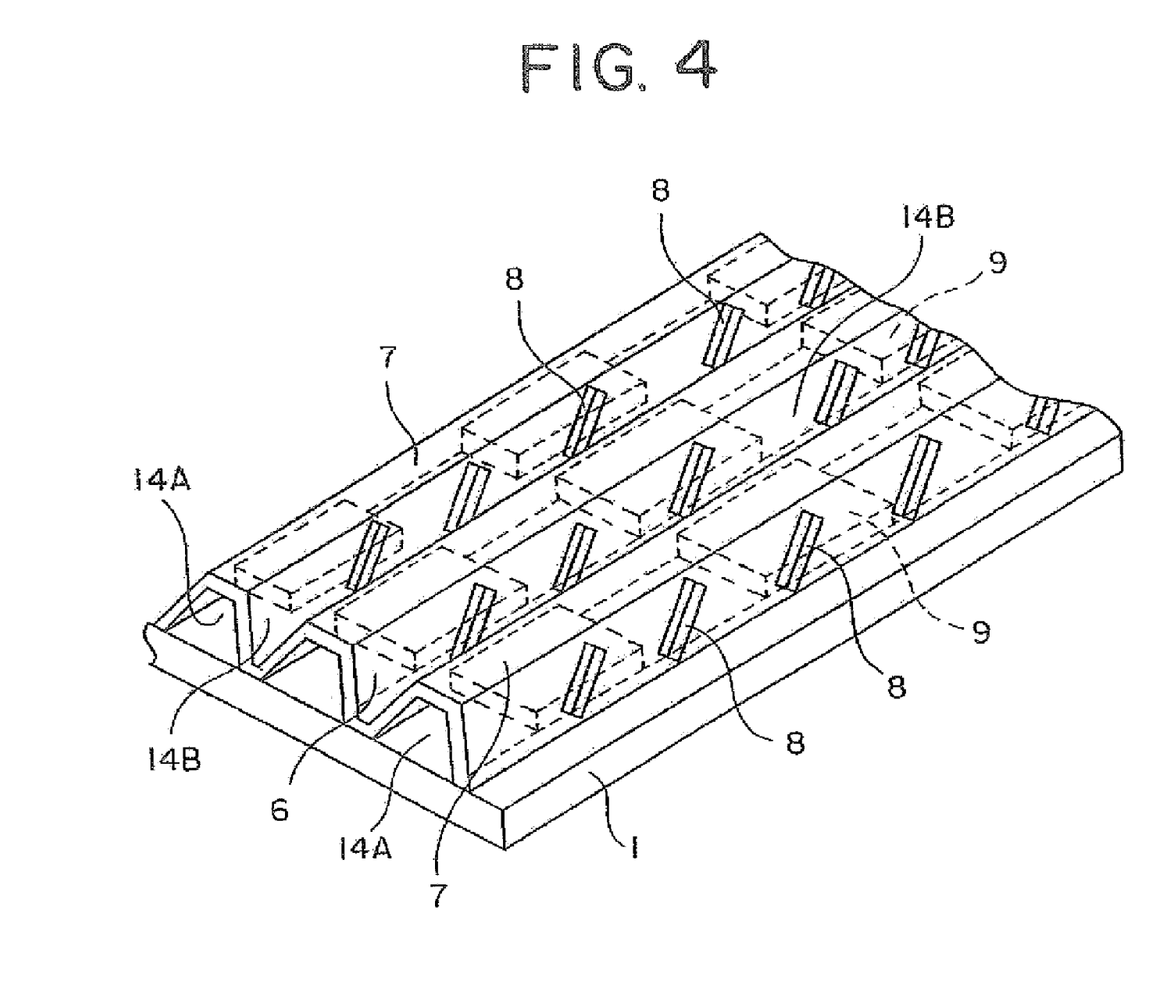
FIG. 4 is a perspective view showing a flow straightening plate of the heat sink shown in FIG. 1.
Figure 5:
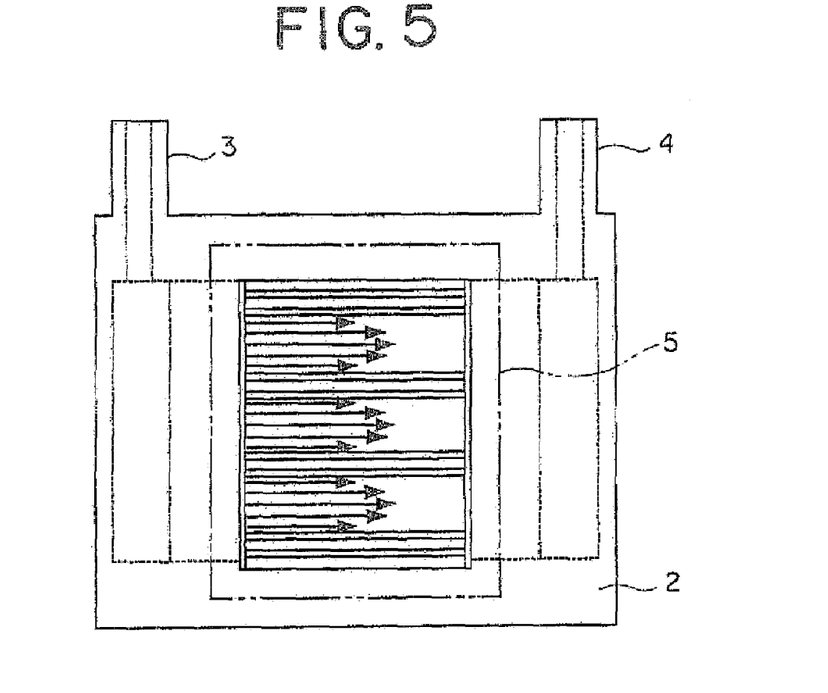
FIG. 5 is a view for illustrating local velocities of cooling water in the heat sink shown in FIG. 1 by lengths of arrows.

FIG. 5 is a view for illustrating the velocity distribution of cooling water internally of the heat sink provided with the flow straightening plate 6. In the figure, the local flow velocities of cooling water are indicated by lengths of arrows.

Figure 6:
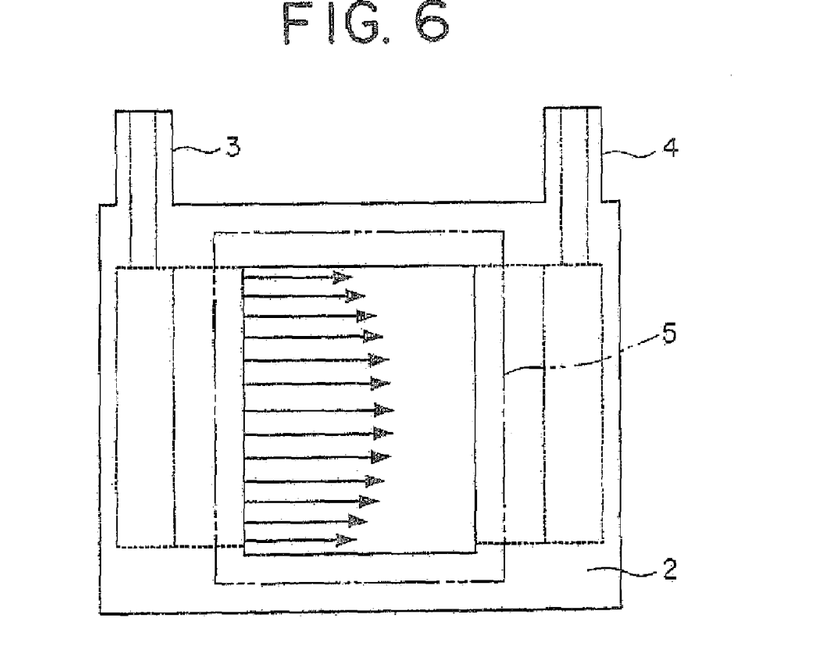
FIG. 6 is a view for illustrating local velocities of cooling water by lengths of arrows in a heat sink in which no flow straightening plate is provided.

In this conjunction, FIG. 6 illustrates a distribution of local velocities of cooling water by the lengths of arrows in the case where the flow straightening plate 6 is not provided.

In general, in the laminar flow, the flow velocity is highest in the middle, becomes lower as the cooling water stream approaches closer to the pipe wall under the effect of viscous friction with the pipe wall and becomes zero on and along the surface of the pipe wall.

Further, it is known that in a zone where the flow velocity is relatively low (on the order of 1 m/s in terms of the head or front velocity) as in the case of the cooling water flowing through the heat sink, the heat transfer efficiency is substantially proportional to the flow velocity.

Consequently, in the heat sink in which the flow straightening plate 6 is not provided, as in the case of the example shown in FIG. 6, the flow velocity of cooling water is high in the mid portion of the heat transfer surface 13 of the power semiconductor module 5 while it is low in the peripheral portion of the heat transfer surface 13. In other words, although the heat transfer efficiency is high in the mid portion of the heat transfer surface 13 of the power semiconductor module 5, it is low in the peripheral portions thereof.

By contrast, in the case of the heat sink according to the present invention in which the flow straightening plate 6 is provided, as shown in FIG. 5, the passage of cooling water is partitioned into a plurality of channels. Consequently, although the flow velocity of cooling water is not uniform within each of the flow straightening channels 14A; 14B into which the coolant passage is partitioned, the flow velocities in the individual flow straightening channels 14A; 14B on average are essentially uniformized over the whole region of the heat transfer surface 13 of the power semiconductor module 5. In other words, high uniformization of radiation can be realized over the whole heat transfer surface 13.

Figure 7:
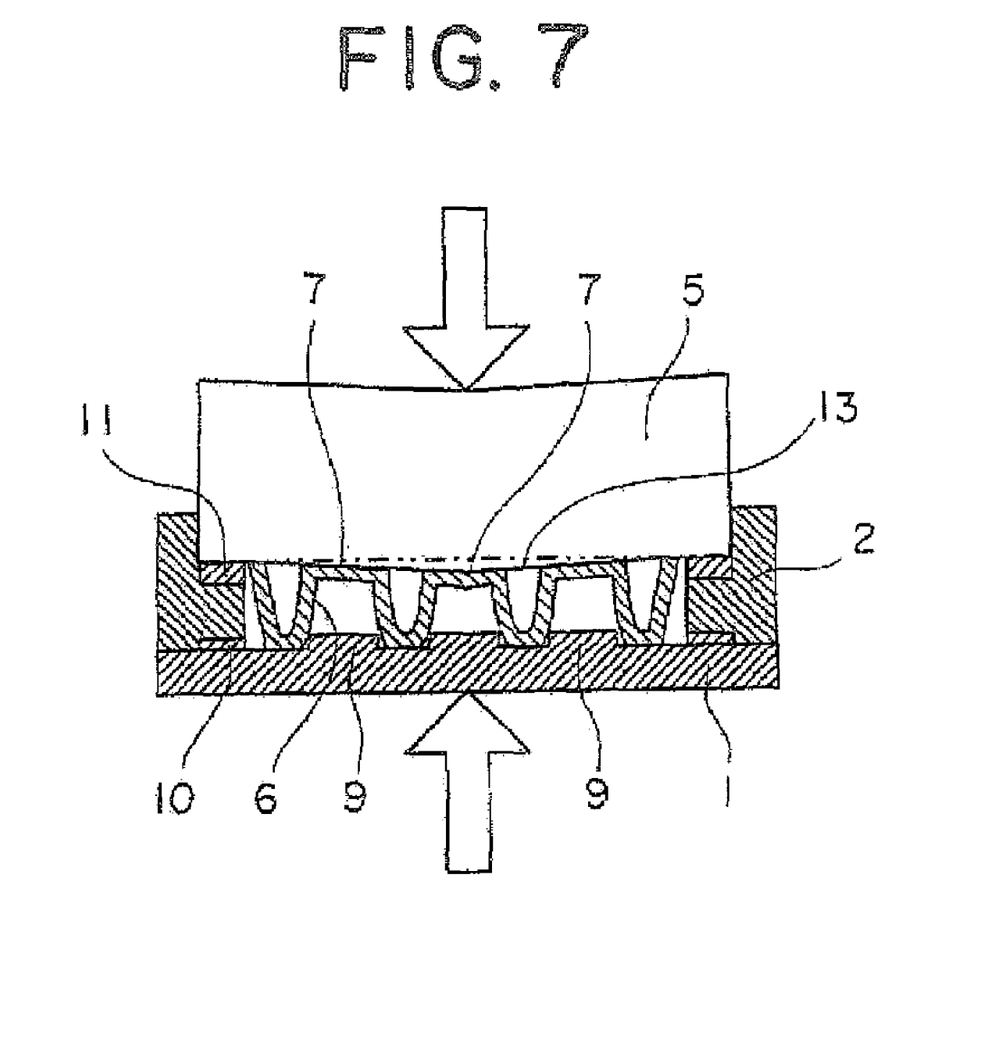
FIG. 7 is a view showing the state in which a deformed power semiconductor module is mounted on the heat sink.

Moreover, since the flow straightening plate 6 has flexibility, the flow straightening plate 6 can be brought into surface contact with the heat transfer surface 13 of the power semiconductor module 5 even when the heat transfer surface 13 is not flat, as shown, for example, in FIG. 7. Thus, the desired thermal conductivity can be ensured.

Figure 7A:
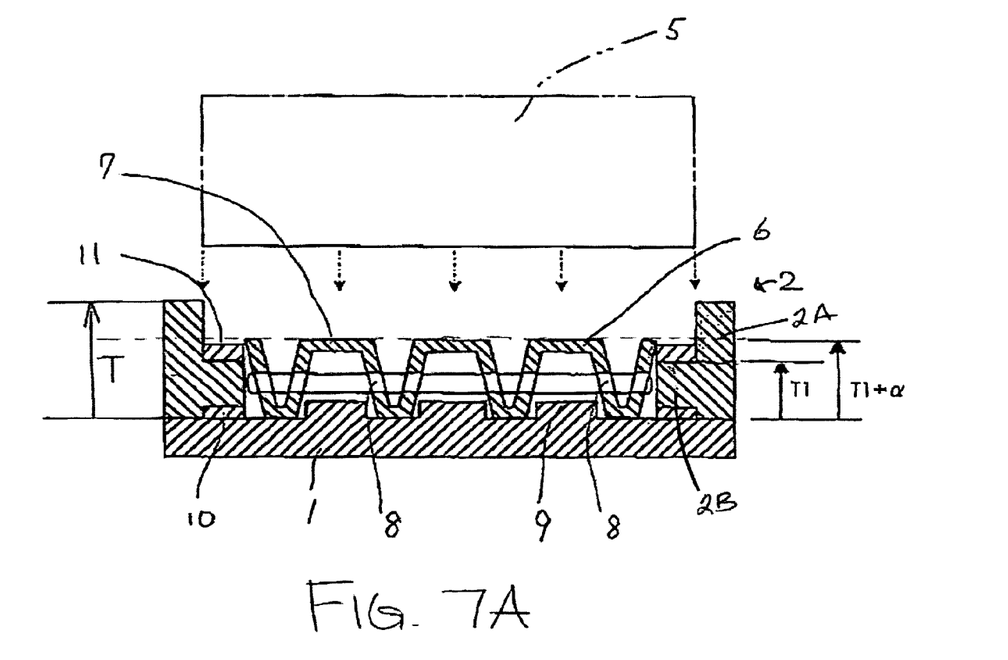
FIG. 7A is another view showing the state in which a deformed power semiconductor module is mounted on the heat sink.

Owing to the flexibility of the flow straightening plate 6, as mentioned above, the flow straightening plate 6 can successfully cope with small distortions brought about by manufacture and assembling errors. Accordingly, in practical application, the flow straightening plate 6 may be so molded as to have a height greater than that of the heat sink body 2 by about 100 μm to 200 μm. As illustraterd in FIG. 7A, the flow straightening plate 6 may have a height (T1+α) greater than a height (T1) of the inner frame 2B of the heat sink body 2, ensuring the surface contact with the heat transfer surface 13 even when the heat transfer surface 13 is not uniform.

Additionally, since the flow straightening plate 6 serves as a supporting member for sustaining a space between the power semiconductor module 5 and the heat sink body 2, the space can be maintained even when the heat transfer surface 13 of the power semiconductor module 5 should be warped due to thermal stress.

Furthermore, through-holes 8 are formed in the flow straightening plate 6 so that the adjacent flow straightening channels 14A; 14B are communicated with each other. Consequently, turbulent flows of cooling water occur when the cooling water flows through the through-holes 8. In this conjunction, it is known that in the state where the flow is disturbed, heat transfer efficiency at the wall surface increases. Thus, by forcibly producing the turbulent flows, as in the case of the heat sink according to the instant embodiment of the invention, the heat transfer efficiency of the flow straightening plate 6 can be much enhanced.

As described hereinbefore, a plurality of ribs 9 are arrayed, respectively, in the flow straightening channels 14A located adjacent to the base member for the purpose of preventing the flow straightening plate 6 from positional deviation in the flow direction of cooling water. By virtue of this arrangement, vortexes of cooling water occur locally, as is illustrated in connection with a location A in FIG. 8, as a result of which turbulence takes place.

Figure 8:
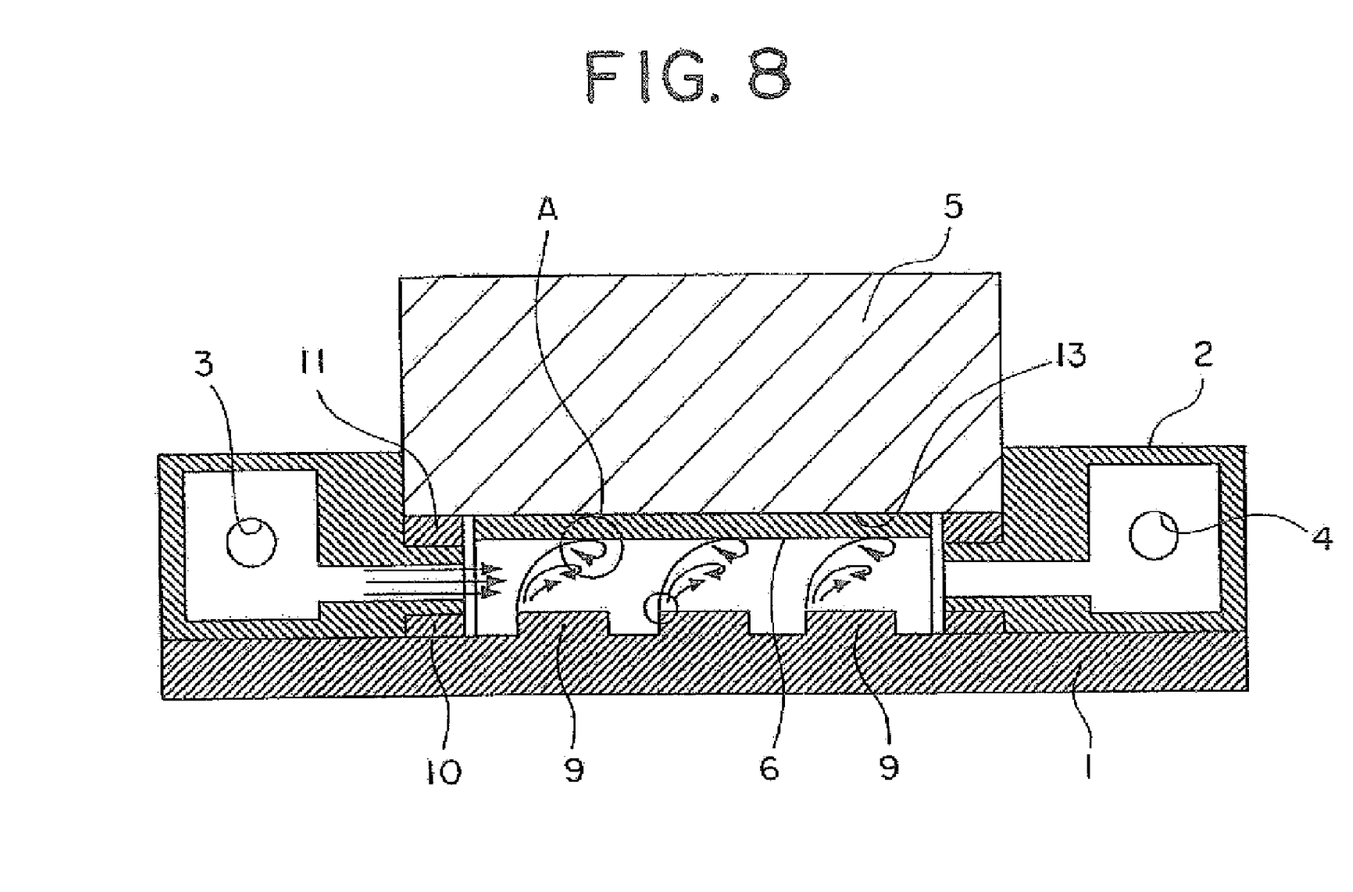
FIG. 8 is a view for illustrating behavior of cooling water upon collision against ribs.

More specifically, since the rib 9 is provided immediately beneath the flat portion 7 which is brought into surface contact with the heat transfer surface 13, turbulence of the cooling water occurs, whereby the heat transfer efficiency of the base member 1 can be increased.

Besides, the flow straightening plate 6 is made of stainless steal. Thus, chemical reaction of the flow straightening plate 6 with metal ions, additive oxides and others contained in cooling water can be suppressed, whereby the initial radiation performance can be maintained for an extended period without undergoing abrasion and alteration.

Many features and advantages of the present invention are apparent from the detailed description and thus it is intended by the appended claims to cover all such features and advantages of the heat sink which fall within the spirit and scope of the invention. Further, since numerous modifications and changes will readily occur to those skilled in the art, it is not desired to limit the invention to the exact construction and operation illustrated and described.

By way of example, although the foregoing description has been made on the assumption that the heat radiation part or source is constituted by the power semiconductor module, the present invention is never restricted thereto. It should be understood that the teachings of the present invention can equally be applied to the heat sink for cooling, for example, antenna modules of control/defense appliances.

Further, although stainless steal is used as the material of the flow straightening plate 6 in the heat sink according to the illustrated embodiment of the invention, it will be appreciated that any other material can be used so far as excellent thermal conductivity and mechanical strength can be ensured.

Furthermore, water is employed as the coolant for cooling the heat radiation part, other liquid or gas may be employed.

Accordingly, all suitable modifications and equivalents may be resorted to, falling within the scope of the invention.

What is claimed is:

1. A heat sink mounted on a heat radiation part through the medium of a coolant, comprising:
   a base member;
   a heat sink body formed in a frame shape having an outer frame surrounding an inner frame, the outer frame having a greater height (T) than a height (T1) of the inner frame, said heat radiation page being receivable inside the outer frame and on top of the inner frame of said heat sink body, said heat body superposed on said base member to form in cooperation with said base member a passage through which said coolant flows, said passage having a base side and a heat transfer side; and
   a bellows-like flow straightening plate disposed between said heat radiation part and said base member in physical contact with said heat radiation part on one side and with said base member on the other side, wherein said bellows-like flow straightening plate is pressed against said base member and said heat radiation part without brazing thereto, and wherein said bellows-like flow straightening plate is formed to have a greater height (T1+α) than the height (T1) of the inner frame of said heat sink body,
   wherein said flow straightening plate partitions said passage into a plurality of flow straightening channels that include base member-side flow straightening channels and heat transfer side flow straightening channels, said channels having an open portion along one longitudinal dimension and a closed portion along an opposite longitudinal dimension, with the open portion defining the heat transfer and base member sides.

2. A heat sink according to claim 1,
   wherein said flow straightening plate has flat portions brought into surface contact with said heat radiation part.

3. A heat sink mounted on a heat radiation part through the medium of a coolant, comprising:
   a base member;
   a heat sink body formed in a frame shape having an outer frame surrounding an inner frame, the outer frame having a greater height (T) than a height (T1) of the inner frame, said heat radiation part being receivable inside the outer frame and on top of the inner frame of said heat sink body, said heat sink body superposed on said base member to form in cooperation with said base member a passage through which said coolant flows, said passage having a base side and a heat transfer side; and
   a bellows-like flow straightening plate disposed between said heat radiation part and said base member in physical contact with said heat radiation part on one side and with said base member on the other side, wherein said bellows-like flow straightening plate is pressed against said base member and said heat radiation part without brazing thereto, and wherein said bellows-like flow straightening plate is formed to have a greater height (T1+α) than the height (T1) of the inner frame of said heat sink body,
   wherein said flow straightening plate partitions said passage into a plurality of flow straightening channels that include base member-side flow straightening channels and heat transfer side flow straightening channels, wherein said base member-side flow straightening channels are provided with a plurality of ribs arrayed adjacent to said base member along the flow direction of said coolant for preventing positional deviation of said flow straightening plate.

4. A heat sink mounted on a heat radiation part through the medium of a coolant, comprising:

a base member;

a heat sink body superposed on said base member to form in cooperation with said base member a passage through which said coolant flows, said passage having a base side and a heat transfer side; and a bellows-like flow straightening plate disposed between said heat radiation part and said base member in physical contact with said heat radiation part on one hand and with said base member on the other hand, wherein said flow straightening plate partitions said passage into a plurality of flow straightening channels that include base member-side flow straightening channels and heat transfer side flow straightening channels, wherein said base member-side flow straightening channels are provided with a plurality of ribs arrayed adjacent to said base member along the flow direction of said coolant for preventing positional deviation of said flow straightening plate, wherein said plurality of ribs are arrayed within an interior space defined by said base member-side flow straightening channels and said ribs are disposed directly on said base member and located under flat portions of said flow straightening plate, so as to face the flat portions of said flow straightening plate thereby causing turbulence of said coolant.

5. A heat sink mounted on a heat radiation part through the medium of a coolant, comprising:

a base member;

a heat sink body superposed on said base member to form in cooperation with said base member a passage through which said coolant flows, said passage having a base side and a heat transfer side; and a bellows-like flow straightening plate disposed between said heat radiation part and said base member in physical contact with said heat radiation part on one hand and with said base member on the other hand, wherein said flow straightening plate partitions said passage into a plurality of flow straightening channels that include base member-side flow straightening channels and heat transfer side flow straightening channels, wherein said base member-side flow straightening channels are provided with said plurality of ribs arrayed adjacent to said base member along the flow direction of said coolant for preventing positional deviation of said flow straightening plate, wherein said plurality of ribs are arrayed within an interior space defined by said base member-side flow straightening channels and said ribs are disposed directly on said base member so as to protrude from the base member and be equally spaced along the flow direction of the coolant.

* * * * *